(12) United States Patent
Kanri et al.

(10) Patent No.: US 9,545,793 B2
(45) Date of Patent: Jan. 17, 2017

(54) PROCESSING METHOD OF SILICON SUBSTRATE, FABRICATING METHOD OF SUBSTRATE FOR LIQUID EJECTION HEAD, AND FABRICATING METHOD OF LIQUID EJECTION HEAD

(71) Applicant: CANON KABUSHIKI KAISHA, Tokyo (JP)

(72) Inventors: Ryoji Kanri, Zushi (JP); Atsunori Terasaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/872,384

(22) Filed: Oct. 1, 2015

(65) Prior Publication Data

US 2016/0101623 A1    Apr. 14, 2016

(30) Foreign Application Priority Data

Oct. 10, 2014  (JP) ................................. 2014-209195

(51) Int. Cl.
| | | |
|---|---|---|
| *H01L 21/00* | (2006.01) | |
| *B41J 2/16* | (2006.01) | |
| *H01L 21/3065* | (2006.01) | |
| *H01L 21/308* | (2006.01) | |

(52) U.S. Cl.
CPC ............. *B41J 2/1628* (2013.01); *B41J 2/1603* (2013.01); *B41J 2/1623* (2013.01); *B41J 2/1629* (2013.01); *B41J 2/1631* (2013.01); *B41J 2/1632* (2013.01); *B41J 2/1642* (2013.01); *B41J 2/1646* (2013.01); *H01L 21/308* (2013.01); *H01L 21/3065* (2013.01)

(58) Field of Classification Search
CPC ... H01L 21/308; H01L 21/3065; B41J 2/1603; B41J 2/1628; B41J 2/1629; B41J 2/1642
USPC .......................................................... 438/21
See application file for complete search history.

(56) References Cited

U.S. PATENT DOCUMENTS

| | | |
|---|---|---|
| 6,679,587 B2 | 1/2004 | Chen et al. |
| 7,103,972 B2 * | 9/2006 | Chen ...................... B41J 2/1404 216/27 |
| 8,518,725 B2 | 8/2013 | Terasaki et al. |

(Continued)

FOREIGN PATENT DOCUMENTS

JP    2011-161915 A    8/2011

*Primary Examiner* — Brook Kebede
(74) *Attorney, Agent, or Firm* — Fitzpatrick, Cella, Harper & Scinto

(57) ABSTRACT

An object of the present invention is to provide a processing method of a silicon substrate, capable of suppressing breakage of thin silicon or a thin film structure of an intermediate layer in etching first and second silicon substrates. According to the present invention, a first silicon substrate and a second silicon substrate are bonded to each other while holding an intermediate layer having an opening between both of the silicon substrates in a bonding step. A closed space defined by at least one of the first and second silicon substrates and the opening at least partly embedded with a filler in a filling step. Furthermore, a liquid supply port is formed in such a manner as to penetrate the filler in the opening and the second silicon substrate from the first silicon substrate in an etching step.

16 Claims, 9 Drawing Sheets

(56) References Cited

U.S. PATENT DOCUMENTS

2012/0028383 A1* 2/2012 Hiramoto .............. B41J 2/1603
438/21

* cited by examiner

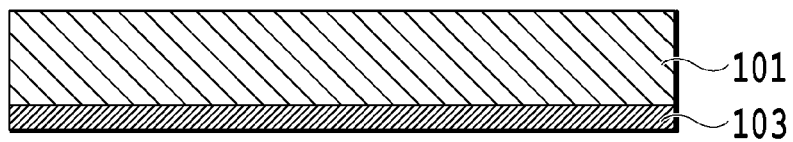
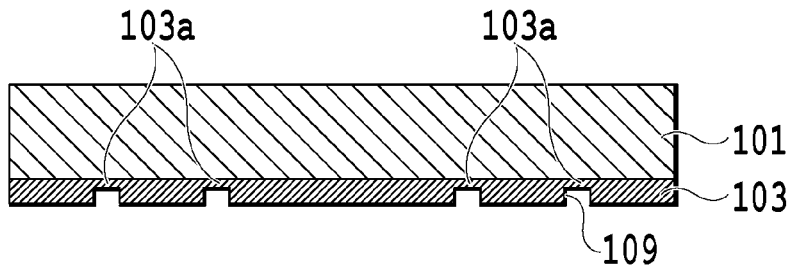
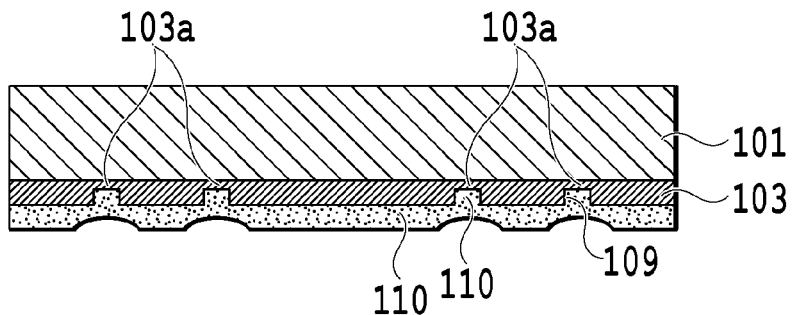
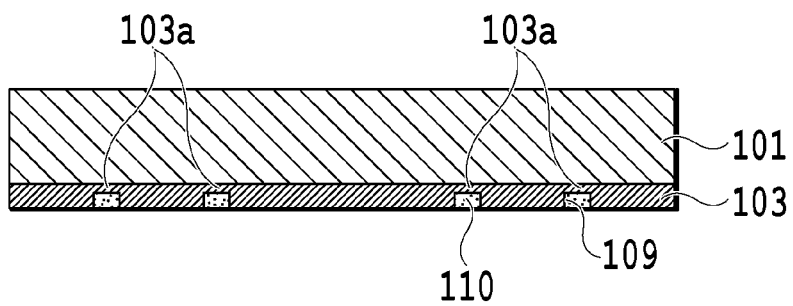
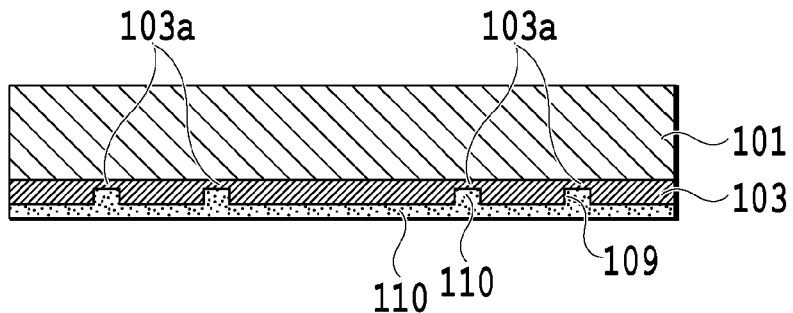

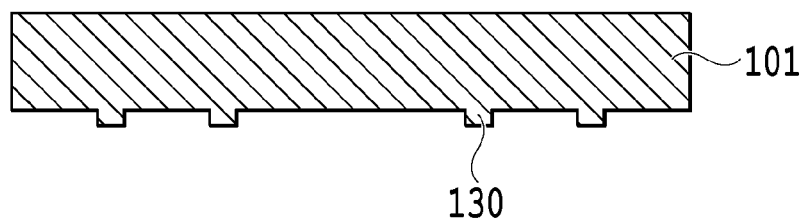
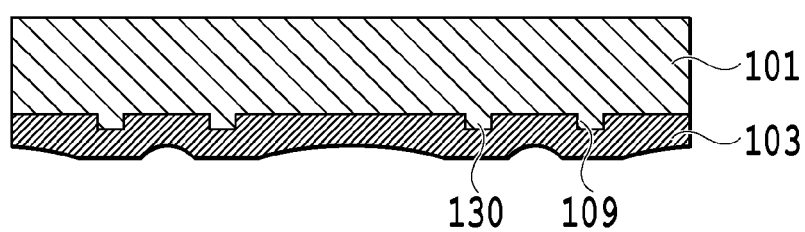
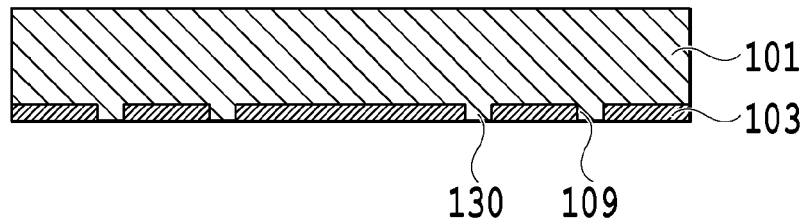
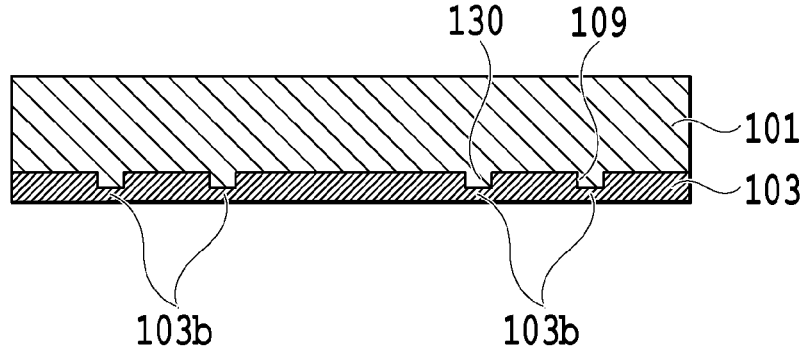

PROCESSING METHOD OF SILICON SUBSTRATE, FABRICATING METHOD OF SUBSTRATE FOR LIQUID EJECTION HEAD, AND FABRICATING METHOD OF LIQUID EJECTION HEAD

BACKGROUND OF THE INVENTION

Field of the Invention

The present invention relates to a processing method of a silicon substrate, in which a through port is formed in a silicon substrate by etching, and further, relates to a fabricating method of a substrate for a liquid ejection head by using the processing method, and a fabricating method of a liquid ejection head.

Description of the Related Art

A fine structure obtained by processing silicon is widely used in the fields of MEMS or a mechanism device for an electric machine. The fine structure is exemplified by a liquid ejection head for ejecting liquid. Examples of devices using the liquid ejection head for ejecting liquid include an ink jet print head for use in an ink jet print system for ejecting ink onto a print medium, followed by printing. The ink jet print head is provided with a substrate having an energy generating element for generating energy to be utilized for ejecting liquid (i.e., ink) and an ejection port, through which the ink supplied from a liquid supply port formed in the substrate is ejected.

U.S. Pat. No. 6,679,587 discloses a fabricating method for the above-described ink jet print head, in which etching is performed in a state in which a mask is incorporated in a silicon substrate. In this method, first, a mask having a penetration pattern for processing a supply port, formed thereat is held between two silicon substrates (i.e., a first silicon substrate and a second silicon substrate). Next, an opening pattern for processing a common liquid chamber is formed at the reverse of the first silicon substrate. Thereafter, as the common liquid chamber is being processed by dry etching at the reverse of the second silicon substrate, the previously held mask for the supply port appears. The supply port is further etched via the pattern formed on the mask, thus forming a through port including the common liquid chamber and the supply port.

In addition, Japanese Patent Laid-Open No. 2011-161915 discloses a fabricating method for enhancing the formation accuracy of a supply port in the fabricating method disclosed in U.S. Pat. No. 6,679,587.

SUMMARY OF THE INVENTION

A processing method of a silicon substrate includes the steps of: bonding a first silicon substrate and a second silicon substrate facing the first silicon substrate while holding an intermediate layer having an opening between the first and second silicon substrates; filling to at least partly embed a closed space defined by at least one of the first and second silicon substrates and the opening with a filler; and etching to form a through port penetrating the filler in the opening and the second silicon substrate from the first silicon substrate.

A fabricating method of a substrate for a liquid ejection head includes the steps of: bonding a first silicon substrate and a second silicon substrate facing the first silicon substrate while holding an intermediate layer having an opening between the first and second silicon substrates; filling to at least partly embed a closed space defined by at least one of the first and second silicon substrates and the opening with a filler; etching to form a liquid supply port penetrating the filler in the opening and the second silicon substrate from the first silicon substrate; and forming an ejection unit having an ejection port for ejecting liquid supplied through the through port.

Further features of the present invention will become apparent from the following description of exemplary embodiments (with reference to the attached drawings.

BRIEF DESCRIPTION OF THE DRAWINGS

FIGS. 3A to 3E are side cross-sectional views showing a fabricating process of an intermediate layer in a second embodiment;

FIGS. 4A to 4D are side cross-sectional views showing a fabricating process of an intermediate layer in a third embodiment;

DESCRIPTION OF THE EMBODIMENTS

Since a mask for forming a supply port is formed in a manner held between the two silicon substrates in the fabricating methods disclosed in U.S. Pat. No. 6,679,587 and Japanese Patent Laid-Open No. 2011-161915, a closed space is defined between the two substrates at a portion at which a mask pattern exists. The closed space is basically held under pressure of environment in which the two silicon substrates are bonded to each other via the mask. For example, the closed space is kept under atmospheric pressure in a case where the two silicon substrates are bonded to each other in atmospheric environment; or the closed space is kept under vacuum in a case where the two silicon substrates are bonded to each other in vacuum environment. Here, gas deaerated from the intermediate layer per se or a reaction product produced during a bonding process may vary the pressure environment of the closed space according to a material of an intermediate layer forming a mask pattern. Therefore, during etching the first silicon substrate or upon completion of etching, a difference may occur between pressure outside of the closed space and pressure inside of the closed space, thereby breaking thin silicon forming the closed space or a film structure of the intermediate layer.

Explanation will be made below on a processing method of a silicon substrate according to the present invention. In particular, explanation will be made on fabricating methods of a substrate for a liquid ejection head and a liquid ejection head, wherein the processing method of the silicon substrate is applied to the fabricating methods. Incidentally, in the following explanation, the liquid ejection head is exemplified by an ink jet print head for use in an ink jet printing apparatus for ejecting ink so as to perform printing onto a print medium.

First Embodiment

Figure 1A:
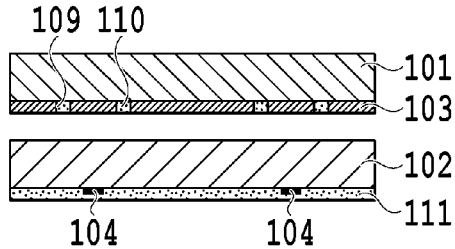
FIGS. 1A to 1H are side cross-sectional views showing a fabricating method of a liquid ejection head in embodiments.

First, as shown in FIG. 1A, there are prepared a second silicon substrate 102 having an ejection energy generating element (i.e., an ejection energy generating unit) 104 and an insulating film 111 at the reverse (i.e., the lower surface in FIG. 1A) thereof, and a first silicon substrate 101. An intermediate layer 103 having a second pattern 109 to be used as a mask pattern in forming a through port (i.e., a support port) is formed on at least either one of these silicon substrates. The intermediate layer 103 has a plurality of through holes (i.e., openings) formed therein, and further, the inside of each of the openings is filled with a filler 110 in a later-described process.

Figure 1E:
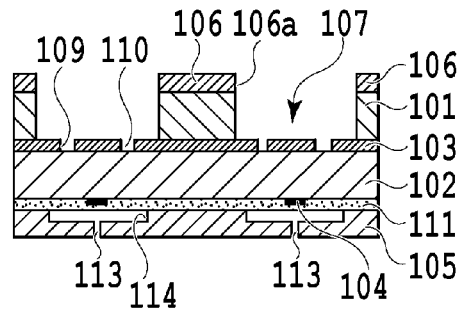
Figure 1B:
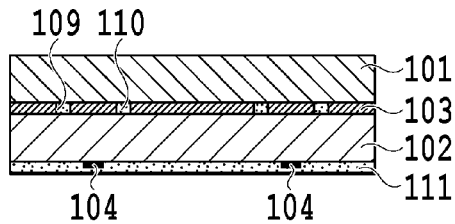

Subsequently, as shown in FIG. 1B, the first silicon substrate 101 and the second silicon substrate 102 are bonded to each other while holding the intermediate layer 103 therebetween. A method for bonding both of the substrates can take various modes according to the material of the intermediate layer 103: for example, bonding with a resin material; direct bonding for bringing activated surfaces into contact with each other, followed by bonding; diffusion bonding using a metallic material; eutectic bonding; and the like.

Figure 1F:
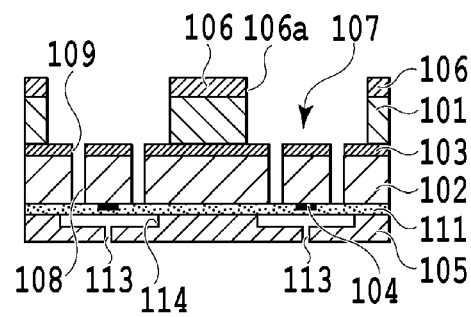
Figure 1C:
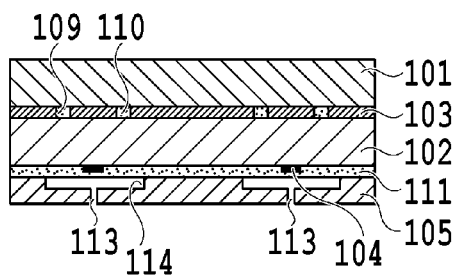

Next, as shown in FIG. 1C, a channel forming layer 105 constituting an ejection port 113 and a liquid channel 114 in communication with the ejection port 113 is formed at the surface of the second silicon substrate 102. Here, the channel forming layer 105, the first and second silicon substrates 101 and 102, and the intermediate layer 103 form a liquid ejection unit.

Figure 1G:
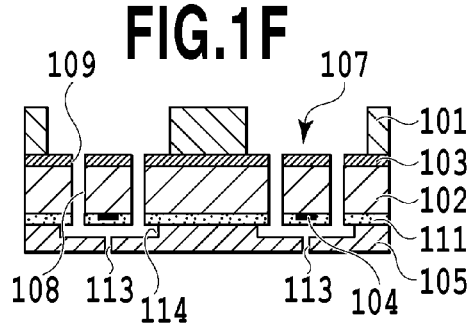
Figure 1D:
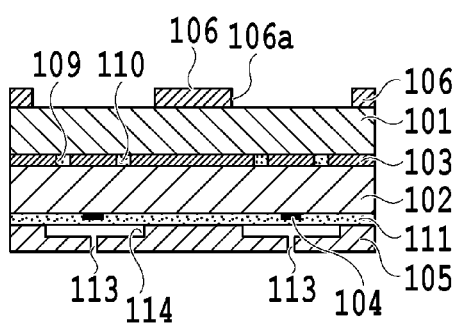

Thereafter, as shown in FIG. 1D, a first mask 106 is formed on the first silicon substrate 101. On the first mask 106 is formed a first pattern 106a for forming a common liquid chamber 107 on the first silicon substrate 101 by etching. The first pattern 106a penetrates the first mask.

Incidentally, the material of the first mask 106 is not particularly limited as long as the first mask 106 can be normally used as an etching mask. For example, an organic material, a silicon compound, a metallic film, and the like can be used. As for the organic material, a photoresist can be used. Moreover, as for the silicon compound, silicon oxide can be used. Additionally, as for the metallic film, chromium and aluminum can be used. In addition, these materials may be arbitrarily laminated.

Next, as shown in FIG. 1E, first etching is performed by using the first mask 106 until the intermediate layer 103 is exposed, thus forming the common liquid chamber 107 serving as a first through port. Dry etching or crystalline anisotropic etching can be used as the first etching. Forming the common liquid chamber 107 by dry etching will be explained in the following embodiments.

In the present embodiment, a closed space defined by the second pattern 109 including an opening formed in such a manner as to penetrate the intermediate layer 103 and the first and second silicon substrates 101 and 102 is filled with the filler 110. As a consequence, there is no difference in pressure between etching environment and the inside of the second pattern 109. Thus, the risk of breakage of a thinned silicon structure can be reduced even immediately before the first etching reaches the intermediate layer 103.

Subsequently, as shown in FIG. 1F, a liquid supply port (hereinafter simply referred to as a supply port) 108 serving as a through port is formed by second etching by using the intermediate layer 103 as a second mask. The supply port 108 is formed in communication with the common liquid chamber 107. At this time, in a case where the filler 110 applied to the inside of the second pattern 109 (i.e., the inside of the opening) formed on the intermediate layer 103 is made of a material that can be etched under the same condition as that for the first or second silicon substrate, the supply port 108 is etched by the first or second etching. That is to say, etching to remove the filler 110 is performed during the etching process in which the common liquid chamber 107 is formed on the first silicon substrate 101 or the etching process in which the through port (i.e., the second through port) 108 serving as the support port is formed on the second silicon substrate 102. Alternatively, in a case where the filler 110 is made of a material that cannot be etched simultaneously with the first etching or the second etching, another etching may be performed during the first etching and the second etching, thereby removing the filler 110.

Figure 1H:
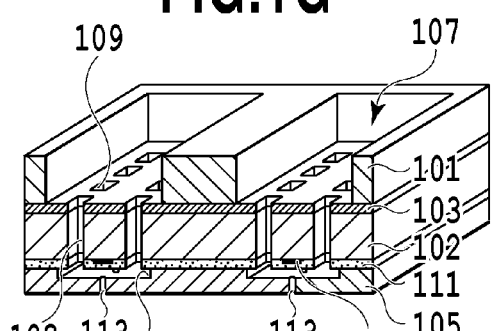

Finally, as shown in FIGS. 1G and 1H, the first mask 106 remaining on the first silicon substrate 101 is removed, thus achieving an ink jet print head serving as a substrate for a liquid ejection head. The first mask 106 may remain on the first silicon substrate 101 in a case where it need not be particularly removed. With the above-described processes, it is possible to fabricate the substrate for the liquid ejection head.

Figure 2A:
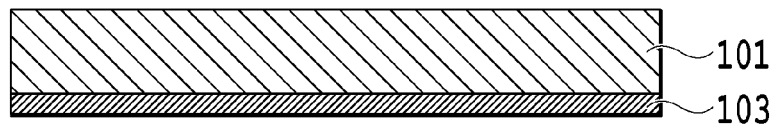
FIGS. 2A to 2E are side cross-sectional views showing a fabricating process of an intermediate layer in a first embodiment.
Figure 2B:
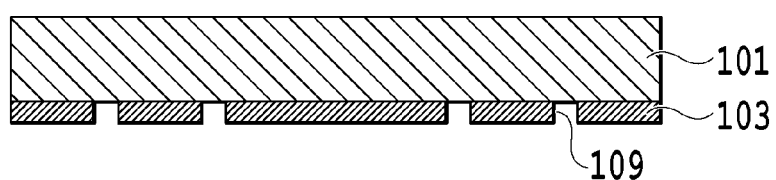
Figure 2C:
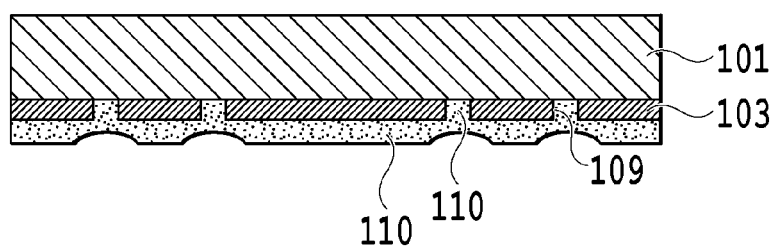

Subsequently, explanation will be more specifically made on a method for forming the filler 110 formed inside of the second pattern 109 formed on the intermediate layer 103 in the present embodiment. First, the intermediate layer 103 is formed on the first silicon substrate 101, as shown in FIG. 2A, before the second pattern 109 for forming the supply port 108 is formed on the intermediate layer 103, as shown in FIG. 2B. Subsequently, the filler 110 is formed in such a manner as to embed the second pattern 109 on the reverse (i.e., the lower surface in FIG. 2C) of the intermediate layer 103, as shown in FIG. 2C. Any materials may be used for the filler 110 as long as the filler 110 can be etched except for the intermediate layer 103. For example, a filler film may be used. Alternatively, in a case where a material that can be etched together with monocrystalline silicon used for the first silicon substrate 101 and the second silicon substrate 102, etching can be achieved simultaneously with removing the silicon substrates, thereby simplifying the removing process. The above-described filler 110 can be formed of, for example, amorphous silicon, polysilicon, silicon nitride, or a metallic film made of aluminum by sputtering or CVD.

Figure 2D:
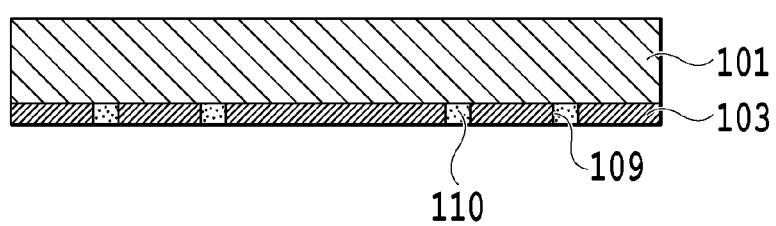
Figure 2E:
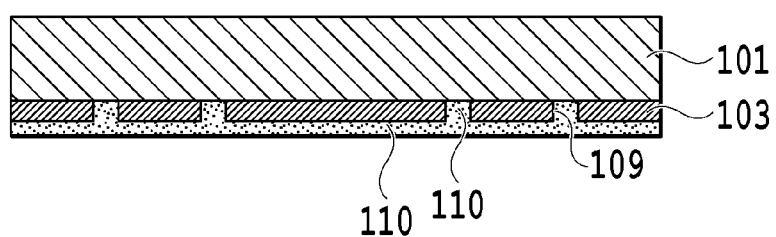

Next, the previously formed filler 110 is planarized. Here, as shown in FIG. 2D, the intermediate layer 103 is exposed, and then, the filler 110 may be planarized such that the reverse (i.e., the lower surface in FIG. 2D) of the filler 110 embedded in the second pattern 109 of the intermediate layer 103 forms the same plane as the reverse (i.e., the lower surface in FIG. 2D) of the intermediate layer 103. Alternatively, in a case where the filler 110 is made of a material such as polysilicon or amorphous silicon that is integrally bonded to the second silicon substrate 102, only the reverse of the filler 110 may be planarized without exposing the intermediate layer 103, as shown in FIG. 2E. With the above-described processes, the silicon substrate for a liquid ejection head can be fabricated.

Since the closed space defined inside of the second pattern 109 formed on the intermediate layer 103 is filled with the filler in the present embodiment, no difference in pressure occurs between the etching environment and the inside of the pattern. Consequently, even if the bottom of the first silicon substrate 101 is thinned immediately before the first etching reaches the intermediate layer 103, it is possible to reduce the risk of breakage of the silicon structure, thus fabricating the silicon substrate at an improved yield.

Second Embodiment

Next, a second embodiment of the present invention will be explained. In the second embodiment, an intermediate layer 103 shown in FIGS. 3A to 3E is formed. Other constituent elements are formed in the same manner as in the first embodiment. Like in the first embodiment, the intermediate layer 103 is formed on a first silicon substrate 101 (see FIG. 3A) in the second embodiment. Subsequently, as shown in FIG. 3B, a second pattern 109 for forming a supply port 108 is formed on the intermediate layer 103. At this time, the second pattern 109 formed on the intermediate layer 103 has an arbitrary thickness such that an opening is formed in such a manner as not to expose the reverse of the first silicon substrate 101. That is to say, the second pattern in the second embodiment is formed into the shape of a recess that does not penetrate the intermediate layer 103.

Thereafter, as shown in FIG. 3C, a filler 110 is formed in such a manner as to cover the second pattern on the intermediate layer 103. The filler 110 can be formed of a metallic film made of aluminum, amorphous silicon, polysilicon, silicon nitride, or the like by sputtering or CVD.

Next, the formed filler 110 is planarized. Here, as shown in FIG. 3D, the reverse (i.e., the lower surface in FIG. 3D) of the intermediate layer 103 is exposed, and then, the filler 110 is planarized such that the filler 110 embedded in the second pattern 109 formed into the recessed shape forms the same plane as the reverse of the first silicon substrate 101. In a case where the filler 110 is made of a material such as polysilicon or amorphous silicon that is integrally bonded to the second silicon substrate 102, only the reverse of the filler 110 may be planarized without exposing the intermediate layer 103, as shown in FIG. 3E.

Hereinafter, a liquid ejection head can be fabricated by carrying out substantially the same processes as those explained in the first embodiment. Here, in the second embodiment, the common liquid chamber 107 is formed by the first etching, as shown in FIG. 1E, before an intermediate layer (i.e., a thin film) 103a remaining on the second pattern 109 need be removed by etching. In this manner, in the second embodiment, in forming the second pattern 109 on the intermediate layer 103, the opening is formed in such a manner as not to expose the first silicon substrate 101 such that the thin film 103a having a predetermined thickness from the obverse (the upper surface in the drawings) remains at a position facing the second pattern 109. As a consequence, the second silicon substrate 102 is not exposed, as viewed on the side of the common liquid chamber 107. Thus, the first etching can suppress any unfavorable advance of the etching of the second silicon substrate 102 by the first etching is suppressed.

Furthermore, in the second embodiment, in a case where the common liquid chamber 107 is formed by the first etching, a closed space defined inside of the second pattern 109 formed on the intermediate layer 103 is filled with silicon in such a manner as to hold the thin film 103a of the intermediate layer 103. Therefore, no difference in pressure occurs between etching environment of the first etching and the inside of the second pattern 109. Consequently, even if the first etching reaches the intermediate layer 103, the risk of breakage of the thin film 103a is reduced, thus expecting the improvement in yield of a substrate for a liquid ejection head.

Third Embodiment

Next, a third embodiment of the present invention will be explained. In the third embodiment, a first silicon substrate 101 and an intermediate layer 103 are formed in processes shown in FIGS. 4A to 4D. Other constituent elements are formed in the same manner as in the first embodiment. In the third embodiment, first, as shown in FIG. 4A, a projecting portion 130 functioning as a filler film, with which a closed space defined inside of a second pattern 109 for forming a supply port 108 is filled, is formed on the silicon substrate 101. The projecting portion 130 may be formed by wet etching or dry etching. Examples of wet etching include etching using a hydrofluoric or nitric acid-based mixture and crystalline anisotropic etching using KOH or TMAH. Examples of dry etching include a Bosch process used in silicon deep etching, a conventional reactive ion etching (non-Bosch), gas etching using $XeF_2$ gas, or other etching methods.

Figure 5A:
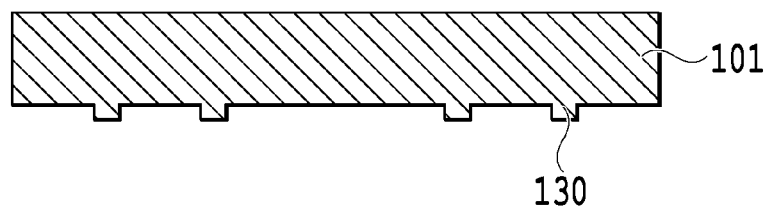
FIGS. 5A to 5C are side cross-sectional views showing a projecting portion to be formed in the third embodiment.
Figure 5B:
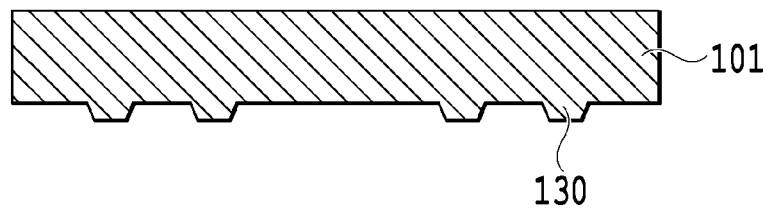
Figure 5C:
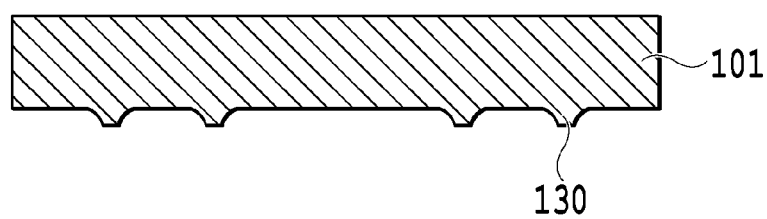

In the Bosch etching or non-Bosch dry etching, a projecting portion 130 having a rectangular cross section is obtained, as shown in FIG. 5A. In the crystalline anisotropic etching using KOH or TMAH, a projecting portion 130 having a trapezoidal cross section is obtained, as shown in FIG. 5B. In the wet etching using a hydrofluoric or nitric acid-based mixture or chemical dry etching using $XeF_2$ gas, a projecting portion 130 having a tapered cross section is obtained, as shown in FIG. 5C.

Subsequently, the intermediate layer 103 is formed in such a manner as to cover the projecting portion 130 (see FIG. 4B). Since the projecting portion is formed at the reverse of the first silicon substrate 101 serving as a ground in forming the intermediate layer 103, the reverse (i.e., the lower surface in FIG. 4B) of the intermediate layer 103 covering the projecting portion becomes uneven as well. In view of this, the intermediate layer 103 is planarized. In this case, the intermediate layer 103 may be planarized enough to expose the projecting portion 130 of the first silicon substrate 101, as shown in FIG. 4C. Alternatively, as shown in FIG. 4D, a thin film 103b having a predetermined thickness may remain at a portion facing the projecting portion 130 without exposing the projecting portion 130.

The thin film 103b having a predetermined thickness from the reverse of the intermediate layer 103 remains without exposing the projecting portion 130 in the above-described manner, thus producing the same effect as that produced by forming the thin film 103a having a predetermined thickness from the obverse of the intermediate layer 103, like the second embodiment. That is to say, since the second silicon substrate 102 is not exposed, as viewed on the side of the common liquid chamber 107, any unfavorable advance of the etching of the second silicon substrate 102 by the first etching is suppressed. In this case as well, it is preferable that the common liquid chamber 107 should be formed by the first etching, before the thin film 103b remaining on the second pattern 109 should be removed by etching. After completion of the processing of the first silicon substrate 101 and the intermediate layer 103, the same processes as the first embodiment are carried out, thus fabricating a liquid ejection head.

Incidentally, in both of the first and third embodiments, examples of materials of the intermediate layer 103 include a resin material, silicon oxide, silicon nitride, silicon carbide, metal other than silicon, metal oxides, and metal nitrides.

In a case where the intermediate layer is formed of the aforementioned material other than a resin material on the first silicon substrate having the above-described projecting portion, silicon reforming such as thermal oxidation or depositing such as sputtering or CVD should be preferably performed. Alternatively, in a case where the intermediate layer is formed of a resin material on the silicon substrate having the projecting portion, a material should be preferably applied by coating or laminated under pressure. Specifically, it is preferable to use a resist-like or dry film-like material.

The deposited material may be planarized by mechanical polishing, chemical mechanical polishing, or other machining. In the case of bonding with a resin material or metallic bonding with gold, copper, tin, or the like, a material may be bonded to even a surface obtained by machining such as cutting. In contrast, a very smooth surface is required in a case where surfaces of silicon or surfaces of silicon and silicon oxide are directly bonded to each other, and therefore, the material need be planarized by mechanical polishing or chemical mechanical polishing.

Moreover, in a case where the intermediate layer is made of a thermoplastic resin material, the intermediate layer is formed, before the material may be planarized under pressure by using a roller or a flat plate. Furthermore, in a case where two substrates are bonded to each other via the intermediate layer made of the resin material, the material may be planarized simultaneously with the bonding under heat and pressure at the same time.

Fourth Embodiment

Next, a fourth embodiment of the present invention will be explained. In the fourth embodiment, a filler to be embedded inside of a recessed second pattern formed on an intermediate layer is formed directly on a first silicon substrate.

Figure 6A:
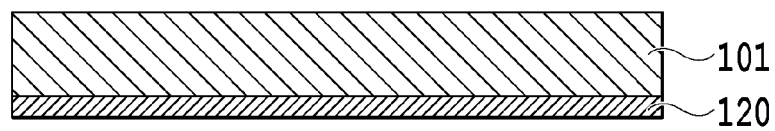
FIGS. 6A to 6F are side cross-sectional views showing a fabricating process of an intermediate layer in a fourth embodiment.
Figure 6B:
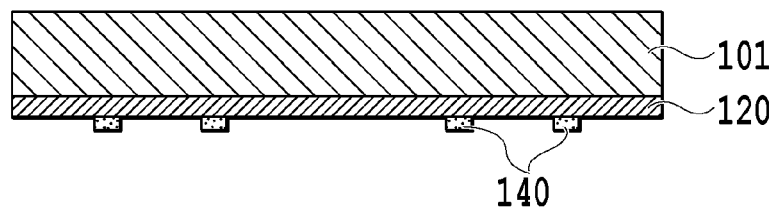

First, as shown in FIG. 6A, a thermal oxidation film 120 serving as an intermediate layer is formed on a first silicon substrate 101. Thereafter, as shown in FIG. 6B, a pattern corresponding to a second pattern 109 is formed of a silicon nitride film 140. Here, the second pattern indicates a pattern for etching a supply port 108 on a second silicon substrate 102, like the above-described embodiments.

Figure 6C:
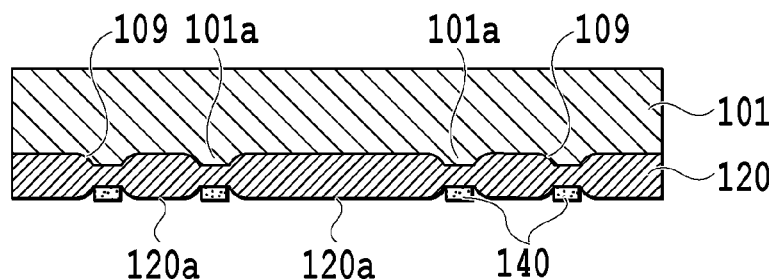

After the silicon nitride film 140 is formed, followed by further thermal oxidization, oxidation proceeds only at a portion 120a at which no silicon nitride film 140 exists on the thermal oxidation film 120, as shown in FIG. 6C. As a consequence, the recessed second pattern (i.e., an opening) 109 is formed on the thermal oxidation film 120 serving as the intermediate layer. In other words, a projecting portion 101a is formed on the first silicon substrate 101, and thus, the projecting portion 101a functions as a filler, with which the second pattern 109 as an opening formed on the intermediate layer 120 is filled. That is to say, in the fourth embodiment, the filler, with which the second pattern 109 is filled, is formed integrally with the first silicon substrate 101.

Figure 6D:
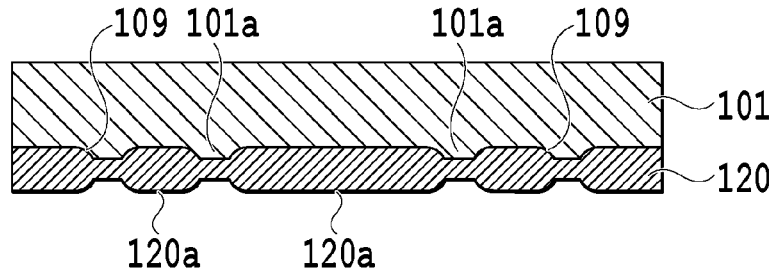
Figure 6E:
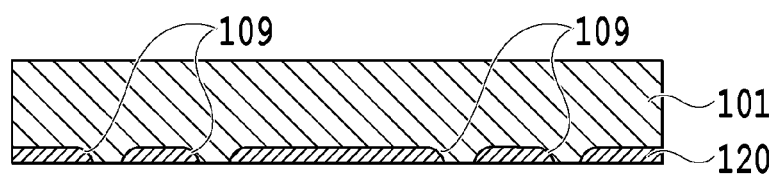
Figure 6F:
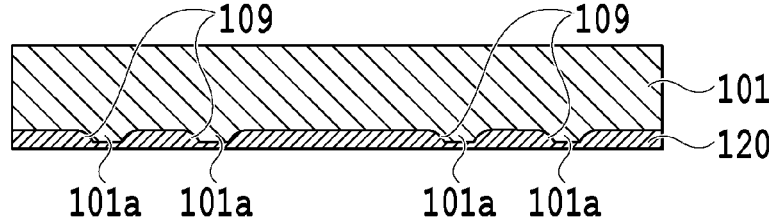

Subsequently, the silicon nitride film 140 is removed (see FIG. 6D), and then, the reverse (i.e., the lower surface in FIG. 6D) of the formed thermal oxidation silicon is planarized. At this time, a thermal oxidation film may be planarized enough to expose the projecting portion 101a of the first silicon substrate 101, as shown in FIG. 6E. Alternatively, a film having a predetermined thickness may remain without exposing the projecting portion 101a, as shown in FIG. 6F.

Incidentally, in the above-described embodiments, in a case where the intermediate layer is planarized enough to expose the second pattern filled therein, it is preferable that the reverse of the second pattern and the reverse of the first silicon substrate should be flush with each other. At this time, different materials are polished. In this case, a polishing rate depends upon a material or a polishing rate varies within a plane, thereby making complete planarization difficult. However, slight unevenness hardly induces a problem because deformation between surfaces in bonding to the second silicon substrate 102 prevents a gap.

Moreover, like the above-described embodiments, a space inside of the second pattern is even partly embedded, so that the volume of the closed space defined inside of the second pattern is reduced, thereby alleviating a stress to be exerted on a film structure including thin silicon or the intermediate layer forming the closed space. In view of this, it is not always necessary to completely planarize a contact surface between the silicon substrate and the intermediate layer. For example, an embedding ratio with respect to the volume of the closed space defined inside of the second pattern is effectively 50% or more, and more preferably, 90% or more and 110% or less.

Next, a description will be specifically given of a fabricating method for the substrate for the liquid ejection head explained in the above-described embodiments by way of examples.

EXAMPLES

Example 1

First, as shown in FIG. 2A, the intermediate layer 103 made of thermal oxidation silicon was formed in a thickness of 1.0 μm on the first silicon substrate 101. Thereafter, OFPR-PR8-PM (trade name) manufactured by TOKYO OHKA KOGYO., LTD. was applied, exposed, and developed, thus obtaining, on the intermediate layer 103, the second pattern 109 for forming the supply port 108. A projecting portion mask aligner UX-4031SC manufactured by USHIO INC. was used for the exposure.

Subsequently, the intermediate layer 103 was wet-etched with a buffered fluoric acid by using a mask corresponding to the second pattern 109, thus obtaining the second pattern 109, as shown in FIG. 2B. The intermediate layer 103 was etched until the first silicon substrate 101 was exposed, and thus, the intermediate layer 103 was completely penetrated in conformity with the second pattern 109.

Next, the filler 110 was formed of a polysilicon film by plasma CVD in such a manner as to embed the inside of the second pattern 109 formed on the intermediate layer 103. Here, in order to completely embed the pattern having a depth of 1.0 μm, a film was formed of polysilicon in about 2.0 μm.

Thereafter, the filler (i.e., the polysilicon film) was planarized by chemical mechanical polishing. The embedded polysilicon and surrounding silicon oxide were polished in such a manner as to be substantially flush with each other (see FIG. 2D). Non-fabric SUBA-800 (manufactured by Nitta Haas Incorporated) was used as polishing cloth. An alkaline polishing liquid containing colloidal silica was used as a polishing agent.

Next, the bonded surface (i.e., the lower surface in FIGS. 2A to 2E) of the intermediate layer 103 formed on the first silicon substrate 101 and the bonded surface (i.e., the upper surface in FIGS. 1A to 1H) of the second silicon substrate 102 were activated by $N_2$ plasma. Thereafter, the bonded surfaces were registered by an aligner manufactured by EVG. And then, the first silicon substrate 101 and the second silicon substrate 102 were bonded via the intermediate layer 103 formed of the silicon oxidation film having the shape of the second pattern by fusion bonding by a bonding apparatus (trade name: EVG520IS) manufactured by EVG (see FIG. 1B).

Subsequently, as shown in FIG. 1C, the liquid channel 114 and the channel forming layer 105 provided with the liquid ejection port 113 in communication with the liquid channel 114 were formed at the surface (i.e., the lower surface in FIG. 1C) opposite to the bonded surface (i.e., the upper surface in FIG. 1C) of the second silicon substrate 102.

Thereafter, as shown in FIG. 1D, the surface (i.e., the lower surface in FIG. 1D) opposite to the bonded surface (i.e., the upper surface in FIG. 1D) of the second silicon substrate 102 was coated with a photosensitive positive type resist (OFPR-PR8-PM (trade name) manufactured by TOKYO OHKA KOGYO., LTD.) 105. And then, the resist 105 was exposed by the projecting portion mask aligner UX-4031SC (trade name) manufactured by USHIO INC., followed by developing. The previously formed thermal oxidation silicon (not shown) was subjected to the wet etching with the buffered fluoric acid together with the intermediate layer 103 by using the pattern formed in the above-described manner as a mask, thus obtaining the first mask 106. Both of the photosensitive positive type resist and the thermal oxidation silicon may be used as a mask member for dry-etching silicon. In this example, a laminate consisting of the photosensitive positive type resist and the thermal oxidation silicon was used as the mask.

Next, as shown in FIG. 1E, the first silicon substrate was etched with the first mask 106. Here, the Bosch process typifying a dry etching technique for deeply etching silicon was used. The first silicon substrate was etched up to the intermediate layer 103 over the entire pattern within a wafer. On the way, the etching was stopped by 5 μm before a position at which the intermediate layer 103 having the second pattern 109 formed thereon was exposed, and then, the inside of the common liquid chamber was observed. As a consequence, no breakage of silicon corresponding to the second pattern was observed.

Subsequently, as shown in FIG. 1F, the second dry etching was performed in the Bosch process by using the intermediate layer 103 as a mask, like the first embodiment, so that the supply port 108 was formed on the second silicon substrate 102.

Finally, as shown in FIG. 1G, the insulating film 111 at the bottom of the supply port 108 and the first mask 106 were removed, thus fabricating the liquid ejection head.

Example 2

First, as shown in FIG. 2A, the intermediate layer 103 made of thermal oxidation silicon was formed in a thickness of 1.5 μm on the first silicon substrate 101. Thereafter, OFPR-PR8-PM manufactured by TOKYO OHKA KOGYO., LTD. was applied, exposed, and developed, thus obtaining, on the intermediate layer 103, the first pattern 109 for forming the supply port 108. A projecting portion mask aligner UX-4031SC manufactured by USHIO INC. was used for the exposure. Subsequently, the intermediate layer 103 was wet-etched with a buffered fluoric acid by using the pattern formed, as shown in FIG. 2B, as a mask, thus obtaining the desired pattern 109. The intermediate layer 103 was etched in a depth of about 1.0 μm in such a manner as not to expose the second silicon substrate 102, and thus, a thickness of 0.5 μm remained.

Next, the filler 110 was formed of the polysilicon film by plasma CVD in such a manner as to embed the inside of the second pattern 109 formed on the first silicon substrate 101. Here, the film was formed of polysilicon in about 2.0 μm such that the pattern was embedded in a depth of 1.0 μm, followed by planarizing.

Thereafter, the filler (i.e., the polysilicon film) was planarized by chemical mechanical polishing. The embedded polysilicon and surrounding silicon oxide were polished in such a manner as to be substantially flush with each other (see FIG. 3D). Non-fabric SUBA-800 (manufactured by Nitta Haas Incorporated) was used as polishing cloth. An alkaline polishing liquid containing colloidal silica was used as a polishing agent.

Here, in planarizing the filler (i.e., the polysilicon film), only the polysilicon film may be planarized without exposing silicon oxide of the intermediate layer (see FIG. 3E). In this case, it is necessary to slightly thicken the polysilicon film in consideration of the embedding depth of the filler 110, the polishing thickness required for planarization, and the thickness of the polysilicon film that should remain.

Figure 7A:
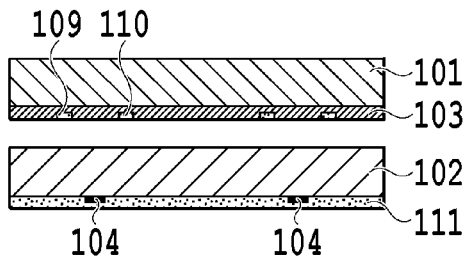
FIGS. 7A to 7H are side cross-sectional views showing a fabricating process of an intermediate layer in Example 2.

Next, the bonded surface (i.e., the lower surface in the drawings) of the intermediate layer 103 formed on the first silicon substrate 101 and the bonded surface (i.e., the upper surface in the drawings) of the second silicon substrate 102 were activated by $N_2$ plasma (see FIG. 7A). Thereafter, the bonded surfaces were registered by an aligner manufactured by EVG. And then, the first silicon substrate 101 and the second silicon substrate 102 were bonded to each other via the intermediate layer 103 made of the silicon oxidation film having the second pattern 109 by fusion bonding by a bonding apparatus (trade name: EVG520IS) manufactured by EVG (see FIG. 7B).

Figure 7E:
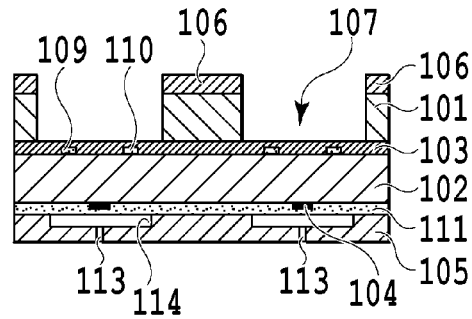
Figure 7B:
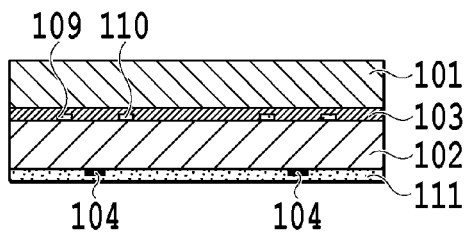
Figure 7F:
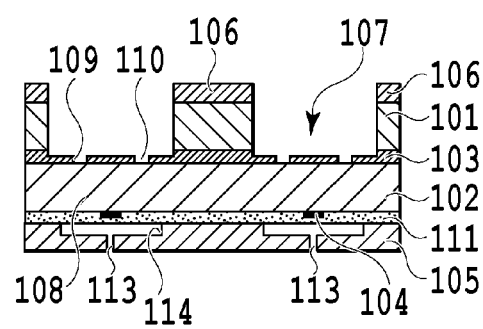
Figure 7C:
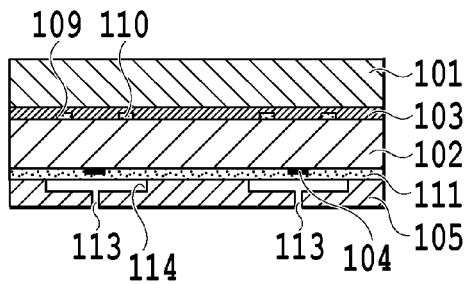

Subsequently, as shown in FIG. 7C, the channel forming layer 105 provided with a liquid ejection nozzle was formed at the surface (i.e., the lower surface in FIG. 7C) opposite to the bonded surface (i.e., the upper surface in FIG. 7C) of the second silicon substrate 102.

Figure 7G:
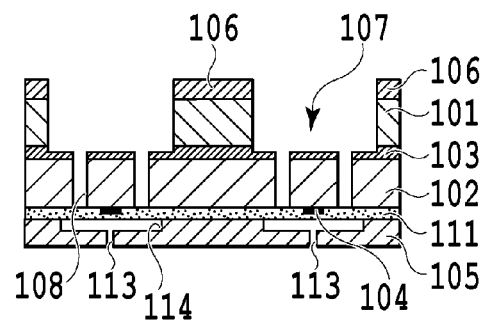
Figure 7D:
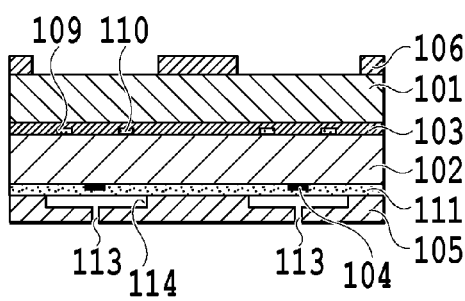

Thereafter, as shown in FIG. 7D, the surface (i.e., the upper surface in FIG. 7D) opposite to the bonded surface (i.e., the lower surface in FIG. 7D) of the first silicon substrate 101 was coated with a photosensitive positive type resist (OFPR-PR8-PM (trade name), not shown, manufactured by TOKYO OHKA KOGYO., LTD.). And then, the resist was exposed by the projecting portion mask aligner UX-4031SC (trade name) manufactured by USHIO INC., followed by developing. The previously formed thermal oxidation silicon (not shown) was subjected to the wet etching with the buffered fluoric acid together with the intermediate layer 103 by using the pattern formed in the above-described manner as a mask, thus obtaining the first mask 106. Both of the photosensitive positive type resist and the thermal oxidation silicon may be used as a mask member for dry-etching silicon. In Example 2, a laminate consisting of the photosensitive positive type resist and the thermal oxidation silicon was used as the mask.

Next, as shown in FIG. 7E, the second silicon substrate was etched with the first mask 106. Here as well, the Bosch process typifying a dry etching technique for deeply etching silicon was used. The first silicon substrate was etched up to the intermediate layer 103 over the entire pattern within a wafer. In Example 2, the second pattern 109 formed on the intermediate layer does not reach the first silicon substrate 101. Consequently, the first etching applied to the first silicon substrate 101 can suppress any unfavorable advance of the etching of the second silicon substrate 102.

Upon the complete exposure of the intermediate layer 103 and completion of the first etching, the inside of the common liquid chamber was observed. As a result, no breakage of silicon oxide of the second pattern 109 was observed.

Subsequently, as shown in FIG. 7F, the silicon oxide film of the intermediate layer exposed to the bottom of the common liquid chamber 107 was etched by 0.5 μm, thereby opening the second pattern 109. The intermediate layer may be etched by wet etching or dry etching. In Example 2, a reactive ion etching technique with a gaseous mixture of $C_4F_2$ and $O_2$ was used.

Thereafter, as shown in FIG. 7G, second dry etching was performed in the Bosch process by using the intermediate layer 103 as the mask, like the first embodiment, so that the supply port 108 was formed on the second silicon substrate 102.

Figure 7H:
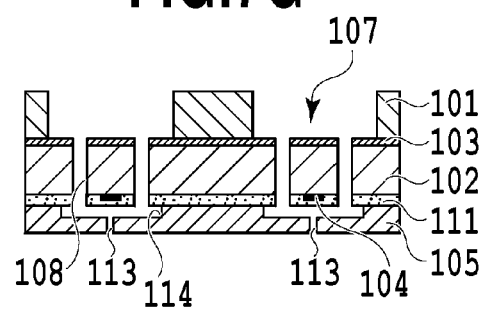

Finally, as shown in FIG. 7H, the insulating film 111 at the bottom of the supply port 108 and the remaining first mask 106 were removed, thus fabricating the liquid ejection head.

Example 3

First, the first silicon substrate 101 was coated with OFPR-PR8-PM manufactured by TOKYO OHKA KOGYO., LTD., followed by exposing and developing, thereby obtaining a pattern in conformity with the shape of the first pattern. Subsequently, the first silicon substrate 101 was etched with the OFPR pattern as the mask, thus forming the projecting portion 130 corresponding to the second pattern 109 (see FIG. 4A). Here, the first silicon substrate 101 was etched in a depth of about 2.0 μm by chemical dry etching using $CF_4$ and $O_4$ plasma (see FIG. 5C).

Figure 8A:
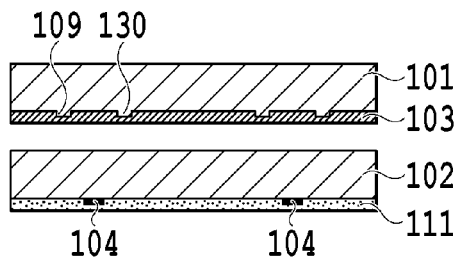
FIGS. 8A to 8H are side cross-sectional views showing a fabricating process of an intermediate layer in Example 3.

Next, as shown in FIG. 8A, the first silicon substrate 101 was coated with a polyether amide resin (HIMAL (trade name) manufactured by Hitachi Chemical Co., Ltd.) in such a manner as to cover the projecting portion 130 formed on the first silicon substrate 101, followed by baking at 100° C. Here, a polyether amide film (i.e., the intermediate layer) 103 was formed in about 3.0 μm so as to embed a pattern in a depth of 2.0 μm, followed by planarizing. The projecting portion 130 previously formed was completely covered with the polyether amide resin without any exposure at a tip.

Figure 8B:
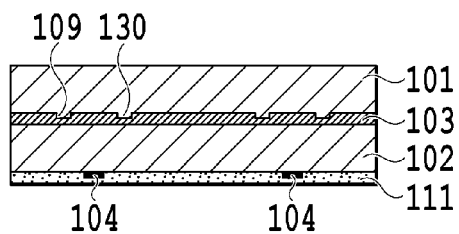

After registration by an aligner manufactured by EVG, the first and second silicon substrates 101 and 102 were heated up to 250° C. via the intermediate layer 103 made of the polyether amide resin by the bonding apparatus (trade name: EVG520IS) manufactured by EVG, and then, bonded to each other under pressure (see FIG. 8B).

Here, although the polyether amide resin used for the intermediate layer 103 was not particularly planarized, it was thermoplastic, and therefore, it could be planarized under heat and pressure at the same time as bonding. The tip of the projecting portion 130 was covered with the polyether amide resin even after the bonding. The recessed second pattern 109 defined by the projecting portion 130 did not penetrate the intermediate layer 103.

Figure 8C:
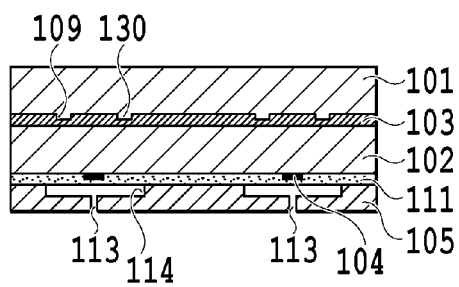

Subsequently, as shown in FIG. 8C, the channel forming layer 105 provided with a liquid ejection nozzle was formed at the surface (i.e., the lower surface in FIG. 8C) opposite to the bonded surface of the second silicon substrate 102.

Figure 8D:
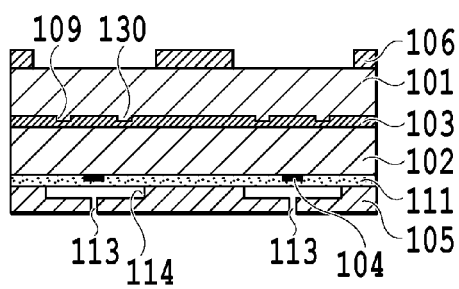

Thereafter, as shown in FIG. 8D, the surface (i.e., the upper surface in FIG. 8D) opposite to the bonded surface of the first silicon substrate 101 was coated with a photosensitive positive type resist (OFPR-PR8-PM (trade name), not shown, manufactured by TOKYO OHKA KOGYO., LTD.). And then, the resist was exposed by the projecting portion mask aligner UX-4031SC manufactured by USHIO INC., followed by developing. The previously formed polyether amide resin (not shown) was subjected to the chemical dry etching together with the intermediate layer 103 by using the pattern formed in the above-described manner as a mask, thus obtaining the first mask 106. Both of the photosensitive positive type resist and the polyether amide resin may be used as a mask member for dry-etching silicon. In Example 3, the two layers, that is, the polyether amide resin and the resist used for patterning the resin were used as the mask.

Figure 8E:
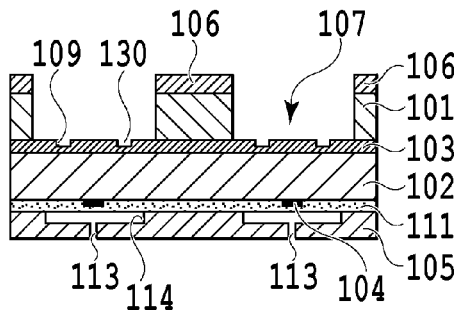
Figure 8F:
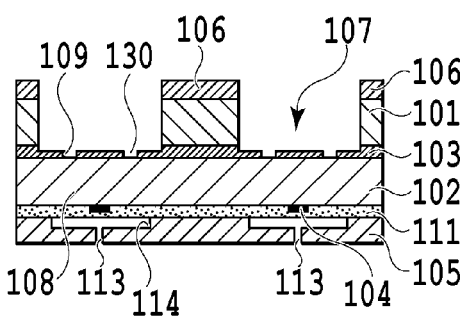

Next, as shown in FIG. 8E, the first silicon substrate 101 was etched with the first mask 106. Here as well, the Bosch process typifying a dry etching technique for deeply etching silicon was used. The first silicon substrate was etched over the entire pattern within a wafer up to the projecting portion 130 of the first silicon substrate 101, that is, the silicon, with which the second pattern 109 was filled. In Example 3, the projecting portion 130 formed on the first silicon substrate 101 was not exposed from the intermediate layer 103, that is, the second pattern 109 did not penetrate the intermediate layer 103. Consequently, the first etching can suppress any unfavorable advance of the etching of the second silicon substrate 102.

Upon completion of the exposure of the intermediate layer 103 and completion of the first etching, the inside of the common liquid chamber was observed. As a result, no damage caused by breakage during etching or no scar caused by a damage was observed around the second pattern 109.

Subsequently, the polyether amide resin of the intermediate layer 103 exposed at the bottom of the common liquid chamber 107 was etched until the second silicon substrate 102 was completely exposed, thereby opening the second pattern 109. The intermediate layer was etched by a reactive ion etching technique with $O_2$ plasma.

Figure 8G:
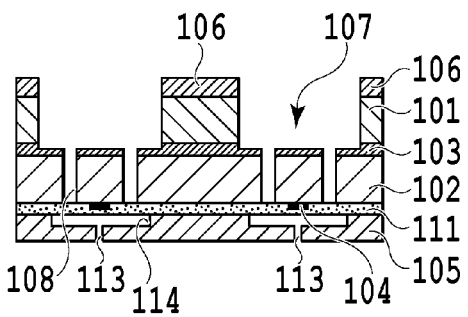

Thereafter, as shown in FIG. 8G, second dry etching was performed in the Bosch process by using the intermediate layer 103 as a mask, so that the supply port 108 was formed on the second silicon substrate 102.

Figure 8H:
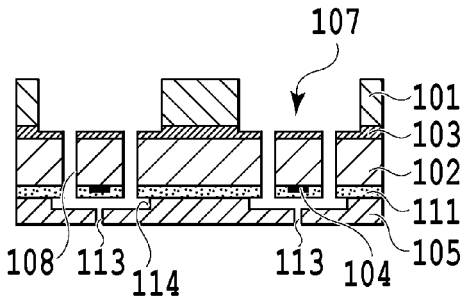

Finally, as shown in FIG. 8H, the insulating film 111 at the bottom of the supply port 108 and the remaining first mask 106 were removed, thus fabricating the liquid ejection head.

Example 4

First, the first silicon substrate 101 was coated with OFPR-PR8-PM manufactured by TOKYO OHKA KOGYO., LTD., followed by exposing and developing, thereby obtaining a pattern in conformity with the shape of the second pattern. Subsequently, the first silicon substrate 101 was etched with the OFPR pattern as a mask, thus forming the projecting portion 130 corresponding to the second pattern 109 (see FIG. 4A). Here, the first silicon substrate 101 was etched in a depth of about 1.0 μm by dry etching.

Next, as shown in FIG. 4B, the intermediate layer 103 was formed of a silicon oxide film by plasma CVD in such a manner as to cover the second pattern 109 corresponding to the projecting portion 130 formed on the first silicon substrate 101. Here, a silicon oxide film was formed in about 2.0 μm so as to embed a pattern in a depth of 1.0 μm, followed by planarizing.

Thereafter, the silicon oxide film was planarized by chemical mechanical polishing. The tip of the projecting portion 130 previously formed on the first silicon substrate 101 and surrounding silicon oxide were polished in such a manner as to be substantially flush with each other (see FIG. 4C). Polyurethane IC-1000 (manufactured by Nitta Haas Incorporated) was used as polishing cloth. An alkaline polishing liquid containing cerium oxide was used as a polishing agent.

Here, in planarizing the silicon oxide, only the silicon oxide may be planarized without exposing the projecting portion 130 of the first silicon substrate 101 (see FIG. 4D). In this case, it is necessary to slightly thicken the silicon oxide in consideration of the embedding depth of the projecting portion 130, the polishing thickness required for planarization, and the thickness of the silicon oxide film that should remain.

Figure 9A:
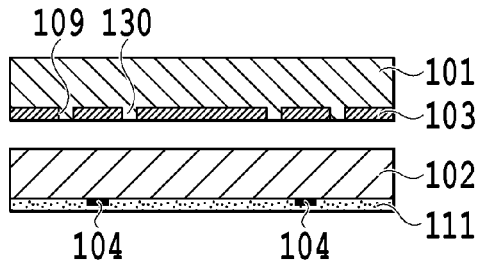
FIGS. 9A to 9G are side cross-sectional views showing a fabricating process of an intermediate layer in Example 4.

Next, the bonded surface (i.e., the lower surface in FIG. 9A) of the intermediate layer 103 formed on the first silicon substrate 101 and the bonded surface (i.e., the upper surface in FIG. 9A) of the second silicon substrate 102 were activated by $N_2$ plasma. Thereafter, the bonded surfaces were registered by the aligner manufactured by EVG. And then, the first silicon substrate 101 and the second silicon substrate 102 were bonded via the intermediate layer 103 made of the silicon oxidation film having the second pattern 109 by fusion bonding in a bonding apparatus (trade name: EVG520IS) manufactured by EVG (see FIG. 9B).

Figure 9E:
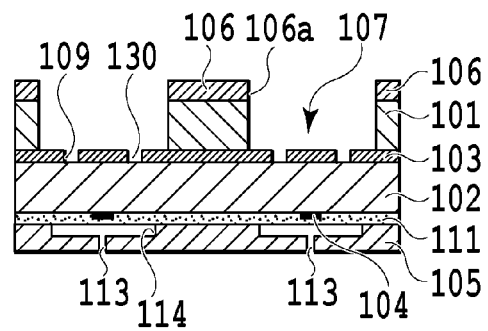
Figure 9B:
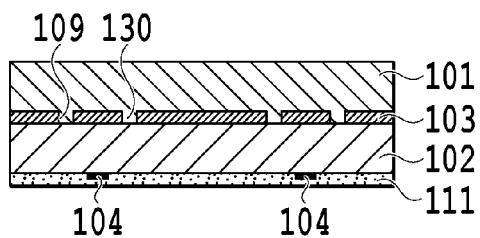
Figure 9F:
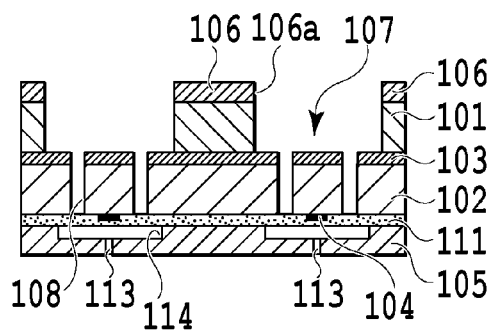
Figure 9C:
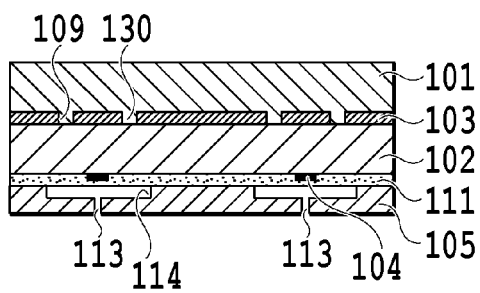

Subsequently, as shown in FIG. 9C, the channel forming layer 105 provided with a liquid ejection nozzle was formed at the surface opposite to the bonded surface of the second silicon substrate 102. Thereafter, as shown in FIG. 9D, the surface (i.e., the upper surface in FIG. 9D) opposite to the bonded surface (i.e., the lower surface in FIG. 9D) of the first silicon substrate 101 was coated with a photosensitive positive type resist (OFPR-PR8-PM (trade name), not shown, manufactured by TOKYO OHKA KOGYO., LTD.). And then, the resist was exposed by the projecting portion mask aligner UX-4031SC (trade name) manufactured by USHIO INC., followed by developing. The previously formed thermal oxidation silicon (not shown) was subjected to the wet etching with the buffered fluoric acid together with the intermediate layer 103 by using the pattern formed in the above-described manner as a mask, thus obtaining the first mask 106. Both of the photosensitive positive type resist and the thermal oxidation silicon may be used as a mask member for dry-etching silicon.

Next, as shown in FIG. 9E, the first silicon substrate was etched by using the first mask 106. Here as well, the Bosch process typifying a dry etching technique for deeply etching silicon was used. The first silicon substrate was etched up to the intermediate layer 103 over the entire pattern within a wafer. On the way, the etching was stopped by 5 µm before a position at which the second pattern 109 was exposed, and then, the inside of the common liquid chamber was observed. As a consequence, no breakage of silicon of the second pattern 109 was observed.

Subsequently, as shown in FIG. 9F, second dry etching was performed in the Bosch process by using the intermediate layer 103 as a mask, like Example 1, so that the supply port 108 was formed on the second silicon substrate 102.

Figure 9G:
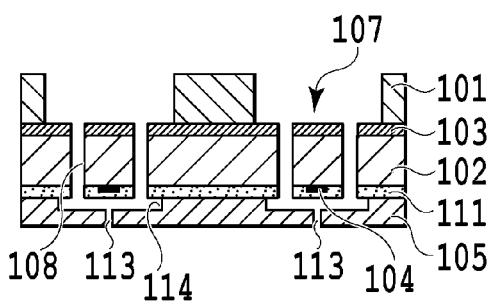
Figure 9D:
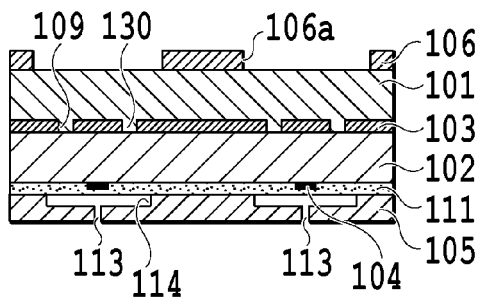

Finally, as shown in FIG. 9G, the insulating film 111 at the bottom of the supply port 108 and the first mask 106 were removed, thus fabricating the liquid ejection head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-209195, filed Oct. 10, 2014 which is hereby incorporated by reference wherein in its entirety.

What is claimed is:

1. A processing method of a silicon substrate comprising the steps of:
    bonding a first silicon substrate and a second silicon substrate facing the first silicon substrate while holding an intermediate layer having an opening between the first and second silicon substrates;
    filling to at least partly embed a closed space defined by at least one of the first and second silicon substrates and the opening with a filler; and
    etching to form a through port penetrating the filler in the opening and the second silicon substrate from the first silicon substrate.

2. The processing method of a silicon substrate according to claim 1, wherein the opening is a hole penetrating the intermediate layer.

3. The processing method of a silicon substrate according to claim 1, wherein the opening is a recess formed at the intermediate layer.

4. The processing method of a silicon substrate according to claim 3, wherein in the etching step, etching to penetrate the recess formed on the intermediate layer is further performed.

5. The processing method of a silicon substrate according to claim 4, wherein in the etching step, etching to penetrate the recess formed on the intermediate layer is performed in a step different from steps of etching to penetrate the first silicon substrate and etching to penetrate the second silicon substrate.

6. The processing method of a silicon substrate according to claim 2, wherein the closed space is defined by the first silicon substrate, the second silicon substrate, and the hole formed at the intermediate layer.

7. The processing method of a silicon substrate according to claim 3, wherein the closed space is defined by the first silicon substrate or the second silicon substrate and the recess.

8. The processing method of a silicon substrate according to claim 1, wherein the closed space is filled in the filling step.

9. The processing method of a silicon substrate according to claim 1, wherein in the filling step, the intermediate layer is covered with a filling film so as to fill a space inside of the opening.

10. The processing method of a silicon substrate according to claim 1, wherein in the filling step, a space inside of the opening is filled with the filler formed integrally with the first silicon substrate or the second silicon substrate.

11. The processing method of a silicon substrate according to claim 1, wherein in the etching step, the following steps are performed:
    etching a first through port that penetrates the first silicon substrate;
    etching to remove the filler, with which the opening is filled; and
    etching to form a second through port corresponding to the opening by using the intermediate layer as a mask.

12. The processing method of a silicon substrate according to claim 1, wherein in the etching step, the following steps are performed in one etching step:
    etching to form a first through port;
    etching to remove the filler; and
    etching to form a second through port.

13. The processing method of a silicon substrate according to claim 1, wherein in the etching step, the following steps are performed in different etching steps:
etching to form a first through port;
etching to remove the filler; and
etching to form a second through port.

14. The processing method of a silicon substrate according to claim 1, wherein in the etching step, etching to remove the filler is performed in an etching step different from steps of etching to form a first through port and etching to form a second through port.

15. A fabricating method of a substrate for a liquid ejection head comprising the steps of:
bonding a first silicon substrate and a second silicon substrate facing the first silicon substrate while holding an intermediate layer having an opening between the first and second silicon substrates;
filling to at least partly embed a closed space defined by at least one of the first and second silicon substrates and the opening with a filler;
etching to form a liquid supply port penetrating the filler in the opening and the second silicon substrate from the first silicon substrate; and
forming an ejection unit having an ejection port for ejecting liquid supplied through the liquid supply port.

16. A fabricating method of liquid ejection head comprising the steps of:
bonding a first silicon substrate and a second silicon substrate facing the first silicon substrate while holding an intermediate layer having an opening between the first and second silicon substrates;
filling to at least partly embed a closed space defined by at least one of the first and second silicon substrates and the opening with a filler;
etching to form a liquid supply port penetrating the filler in the opening and the second silicon substrate from the first silicon substrate; and
forming, on the second silicon substrate, a liquid ejecting unit including an ejection energy generating unit for generating ejection energy for ejecting liquid and an ejection port for ejecting liquid supplied through the liquid supply port by ejection energy of the ejection energy generating unit.

* * * * *